US011303262B2

(12) United States Patent
Lee et al.

(10) Patent No.: US 11,303,262 B2
(45) Date of Patent: Apr. 12, 2022

(54) BULK-ACOUSTIC WAVE RESONATOR

(71) Applicant: SAMSUNG ELECTRO-MECHANICS CO., LTD., Suwon-si (KR)

(72) Inventors: Tae Kyung Lee, Suwon-si (KR); Je Hong Kyoung, Suwon-si (KR); Moon Chul Lee, Suwon-si (KR); Jin Suk Son, Suwon-si (KR); Ran Hee Shin, Suwon-si (KR); Hwa Sun Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 281 days.

(21) Appl. No.: 16/590,768

(22) Filed: Oct. 2, 2019

(65) Prior Publication Data
US 2020/0395912 A1 Dec. 17, 2020

(30) Foreign Application Priority Data

Jun. 14, 2019 (KR) .................. 10-2019-0070782

(51) Int. Cl.
*H03H 9/02* (2006.01)
*H03H 9/13* (2006.01)
*H03H 9/05* (2006.01)
*H03H 9/17* (2006.01)

(52) U.S. Cl.
CPC ...... *H03H 9/02102* (2013.01); *H03H 9/0514* (2013.01); *H03H 9/13* (2013.01); *H03H 9/173* (2013.01)

(58) Field of Classification Search
CPC .... H03H 9/02102; H03H 9/13; H03H 9/0514; H03H 9/173; H03H 9/02149; H03H 9/132; H03H 9/17; H03H 9/25; H03H 9/178
See application file for complete search history.

(56) References Cited

U.S. PATENT DOCUMENTS

| 6,060,818 A * | 5/2000 | Ruby ............ H03H 3/02 29/25.35 |
| 7,535,322 B2 * | 5/2009 | Park ............ H03H 9/0542 333/187 |
| 2006/0139121 A1 * | 6/2006 | Jhung ............ H03H 9/0542 333/133 |
| 2009/0261922 A1 | 10/2009 | Umeda |
| 2017/0237409 A1 * | 8/2017 | Han ............ H01L 41/047 310/348 |
| 2018/0062619 A1 * | 3/2018 | Yi ............ H03H 9/174 |

FOREIGN PATENT DOCUMENTS

| JP | 2006-14096 A | 1/2006 |
| JP | 4835238 B2 | 12/2011 |
| JP | 5018788 B2 | 9/2012 |

* cited by examiner

*Primary Examiner* — Jeffrey M Shin
(74) *Attorney, Agent, or Firm* — NSIP Law

(57) ABSTRACT

A bulk-acoustic wave resonator is provided. The bulk-acoustic wave resonator comprises a substrate comprising an external connection electrode; a connection layer connected to the external connection electrode and disposed on the substrate; a first electrode disposed to cover at least a portion of the connection layer; a piezoelectric layer disposed to cover at least a portion of the first electrode; and a second electrode disposed to cover at least a portion of the piezoelectric layer. The connection layer may be disposed to surround a cavity and may be connected to the first electrode and the second electrode.

19 Claims, 12 Drawing Sheets

BULK-ACOUSTIC WAVE RESONATOR

CROSS-REFERENCE TO RELATED APPLICATION

This application claims the benefit under 35 USC § 119(a) of Korean Patent Application No. 10-2019-0070782 filed on Jun. 14, 2019 in the Korean Intellectual Property Office, the entire disclosure of which is incorporated herein by reference for all purposes.

BACKGROUND

1. Field

The following description relates to a bulk-acoustic wave resonator.

2. Description of Related Art

As 5G communications modules have recently become popular, 5G bulk-acoustic wave (BAW) filters are being developed. In BAW filters for 5G, as a communications distance is decreased, signal strength and power are increased, and a temperature of a resonator in the BAW filter is closely correlated with the increase in the power, such that a relationship between the temperature of the resonator and the increase in the power is linear.

Therefore, it may be beneficial to develop a structure that appropriately dissipates an increase in the temperature generated in the resonator.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a bulk-acoustic wave resonator includes a connection layer disposed on a substrate, a first electrode disposed to cover at least a portion of the connection layer, a piezoelectric layer disposed to cover at least a portion of the first electrode, and a second electrode disposed to cover at least a portion of the piezoelectric layer, wherein the connection layer is disposed to surround a cavity, and is disposed to be connected to at least one of the first electrode and the second electrode.

The bulk-acoustic wave resonator may further include a substrate including an external connection electrode, wherein the connection layer is connected to the external connection electrode.

The connection layer may include a first metal layer containing at least one of aluminum (Al), copper (Cu), and tungsten (W).

The connection layer may further include a barrier layer disposed at least below the first metal layer.

The barrier layer may be formed of at least one of manganese oxide (MnO), zirconium oxide (ZrO$_2$), aluminum nitride (AlN), lead zirconate titanate (PZT), gallium arsenide (GaAs), hafnium oxide (HfO$_2$), aluminum oxide (Al$_2$O$_3$), titanium oxide (TiO$_2$), zinc oxide (ZnO), aluminum (Al), nickel (Ni), chromium (Cr), platinum (Pt), gallium (Ga), hafnium (Hf), silicon dioxide (SiO$_2$), silicon nitride (Si$_3$N$_4$), titanium (Ti), titanium nitride (TiN), tantalum (Ta), and tantalum nitride (TaN).

The bulk-acoustic wave resonator may further include a sacrificial layer disposed to be extended from the connection layer.

The bulk-acoustic wave resonator may further include metal pads connected to the connection layer.

The bulk-acoustic wave resonator may further include a seed layer disposed on at least a top surface of the connection layer.

The seed layer may be formed of a material containing at least one of titanium (Ti), titanium nitride (TiN), tantalum (Ta), and tantalum nitride (TaN).

The bulk-acoustic wave resonator may further include an insertion layer disposed between the first electrode and the piezoelectric layer.

In a general aspect, a bulk-acoustic wave resonator includes a substrate, an etching preventing layer disposed on the substrate and disposed to surround a cavity, a sacrificial layer disposed to surround the etching preventing layer, a connection layer disposed in the sacrificial layer, a first electrode which has a portion connected to the connection layer, a piezoelectric layer which has at least a portion disposed to cover the first electrode, and a second electrode disposed to cover at least a portion of the piezoelectric layer, wherein the connection layer is connected to the first electrode and the second electrode.

The bulk-acoustic wave resonator may further include an external connection electrode connected to the connection layer, and disposed to penetrate through the substrate and the sacrificial layer.

The connection layer may include a first metal layer containing at least one of aluminum (Al), copper (Cu), and tungsten (W).

The connection layer may further include a barrier layer disposed below at least the first metal layer.

The barrier layer may be formed of at least one of manganese oxide (MnO), zirconium oxide (ZrO$_2$), aluminum nitride (AlN), lead zirconate titanate (PZT), gallium arsenide (GaAs), hafnium oxide (HfO$_2$), aluminum oxide (Al$_2$O$_3$), titanium oxide (TiO$_2$), zinc oxide (ZnO), aluminum (Al), nickel (Ni), chromium (Cr), platinum (Pt), gallium (Ga), hafnium (Hf), silicon dioxide (SiO$_2$), silicon nitride (Si$_3$N$_4$), titanium (Ti), titanium nitride (TiN), tantalum (Ta), and tantalum nitride (TaN).

The bulk-acoustic wave resonator may further include a seed layer disposed at least on a top surface of the connection layer.

The seed layer may be formed of a material containing at least one of titanium (Ti), titanium nitride (TiN), tantalum (Ta), and tantalum nitride (TaN).

The connection layer may have a thickness corresponding to a thickness of the sacrificial layer.

In a general aspect, a bulk-acoustic wave resonator includes a substrate, a sacrificial layer, a connection layer disposed on the substrate, a first electrode disposed on an upper surface of the connection layer, and connection electrodes disposed on a lower surface of the connection layer, wherein the connection layer is disposed within the sacrificial layer, and wherein the connection electrodes are disposed to penetrate the substrate.

The connection layer may include a first metal layer, and a barrier layer disposed below the first metal layer.

Figure 1:
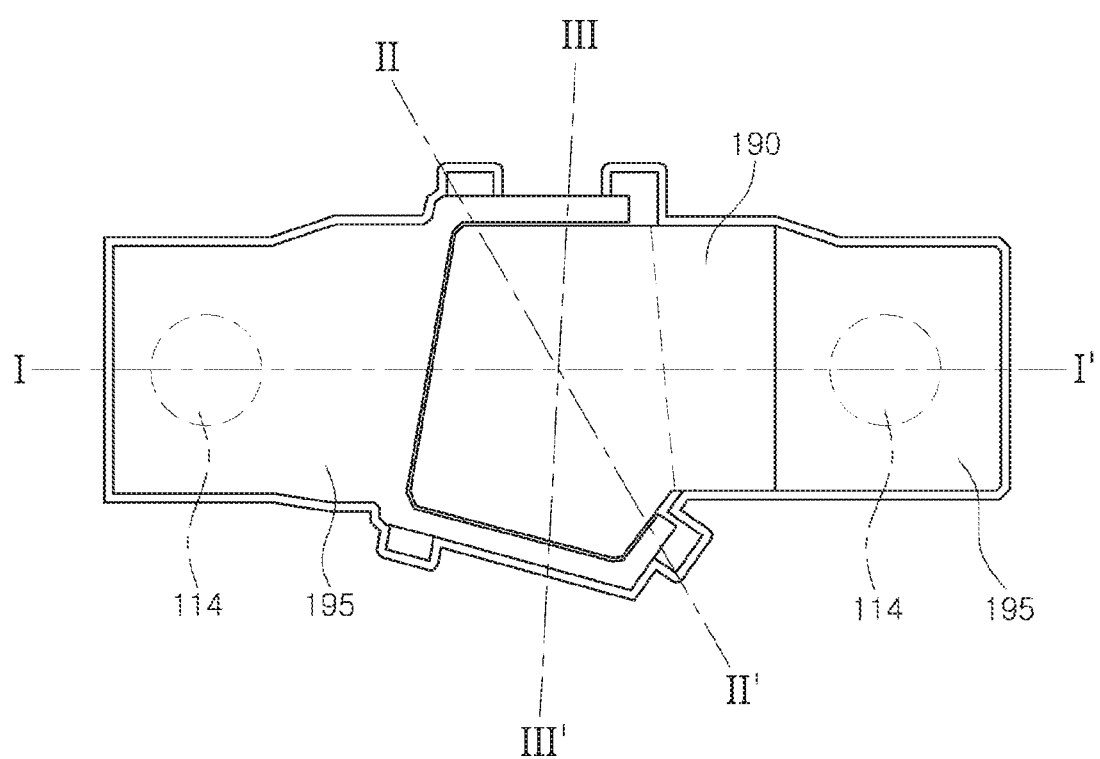
FIG. 1 is a plan view illustrating an example of a bulk-acoustic wave resonator.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains after an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

Figure 2:
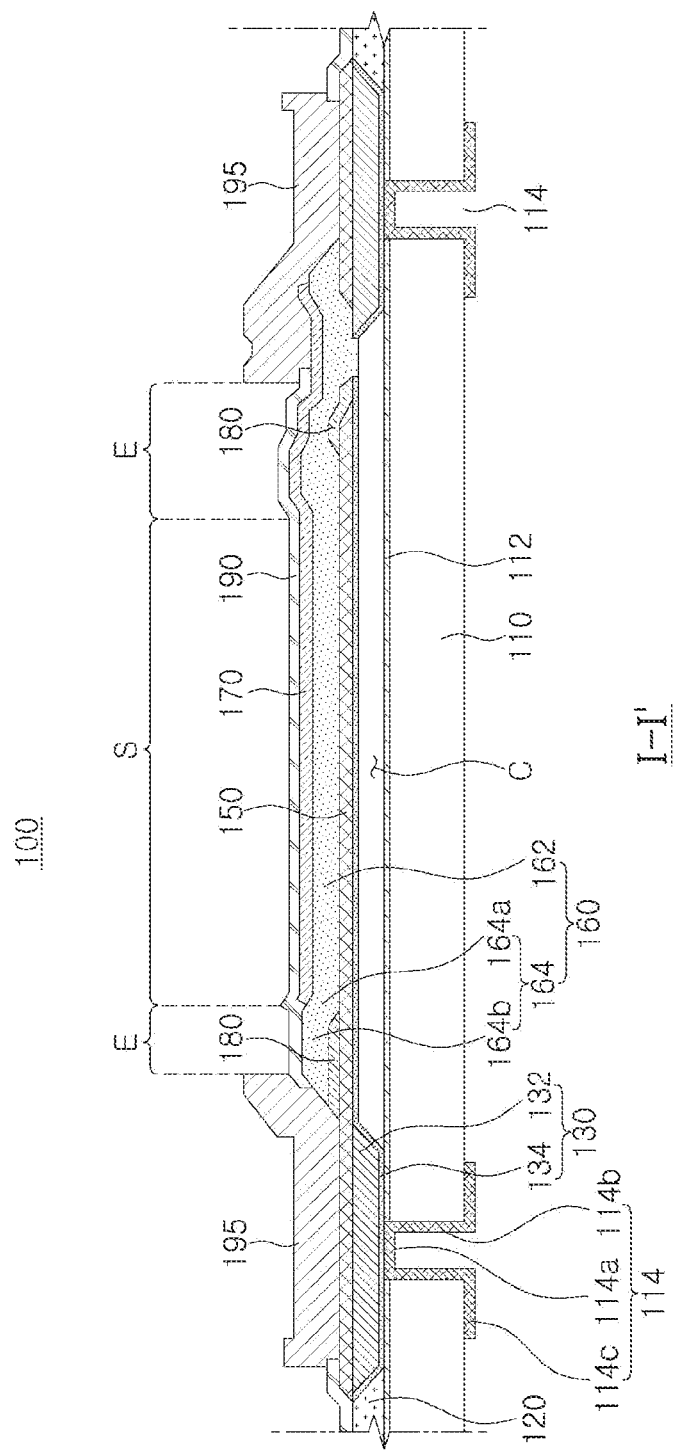
FIG. 2 is a cross-sectional view taken along the line I-I' of FIG. 1.
Figure 3:
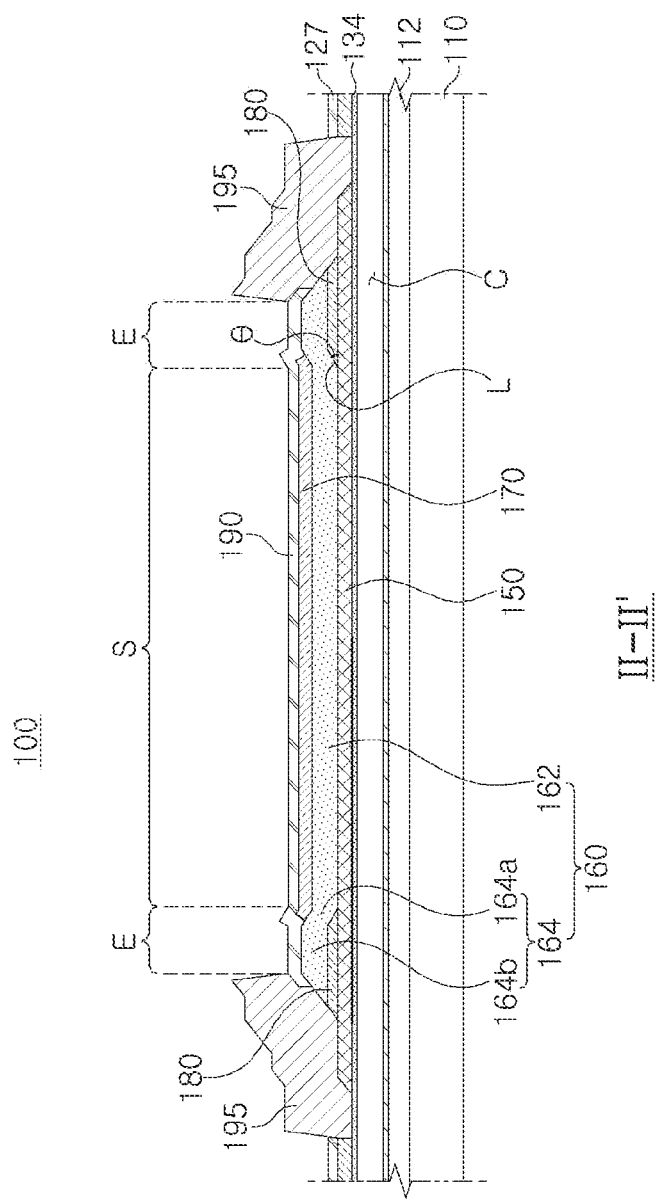
FIG. 3 is a cross-sectional view taken along the line II-II' of FIG. 1.
Figure 4:
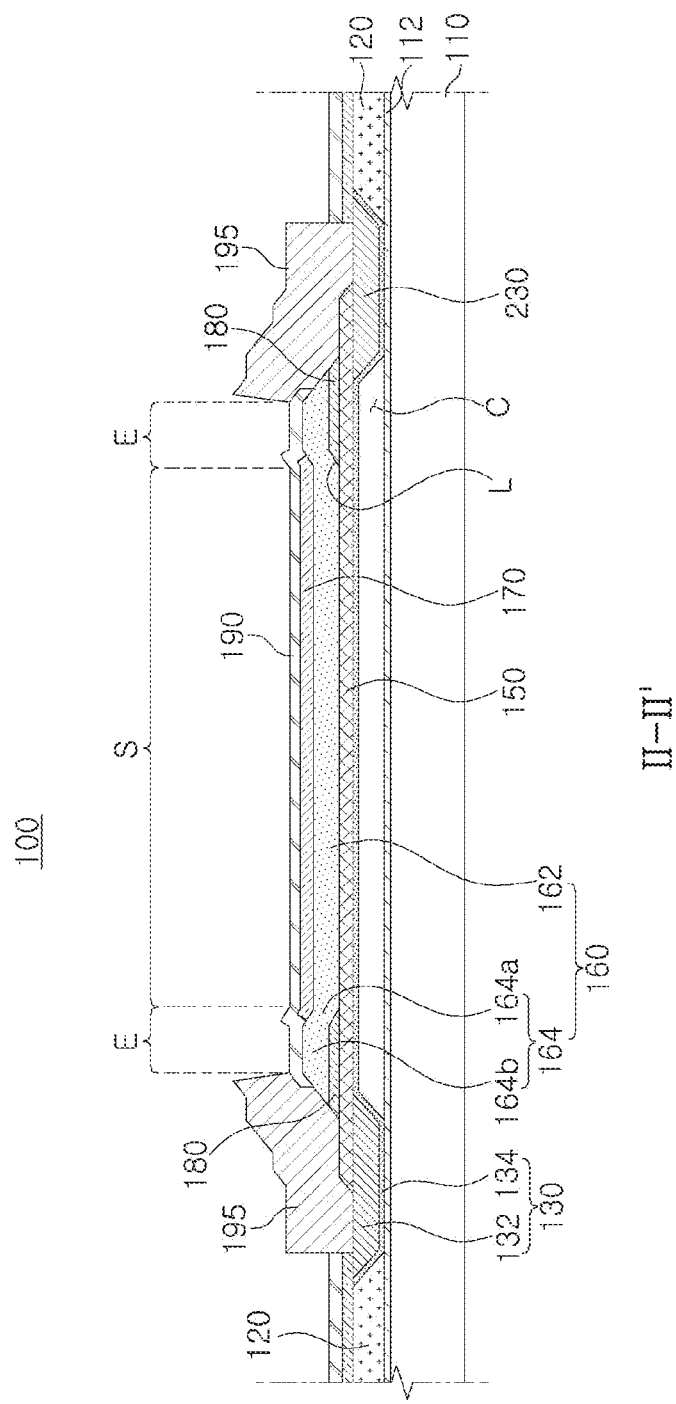
FIG. 4 is a cross-sectional view taken along the line III-III' of FIG. 1.

FIG. 1 is a plan view illustrating an example of a bulk-acoustic wave resonator in accordance with one or more embodiments, FIG. 2 is a cross-sectional view taken along the line I-I' of FIG. 1, FIG. 3 is a cross-sectional view taken along the line II-II' of FIG. 1, and FIG. 4 is a cross-sectional view taken along the line III-III' of FIG. 1.

Referring to FIGS. 1 through 4, a bulk-acoustic wave resonator 100 according to an example may include, for example, a substrate 110, a sacrificial layer 120, connection layers 130, a first electrode 150, a piezoelectric layer 160, a second electrode 170, an insertion layer 180, a passivation layer 190, and metal pads 195.

In an example, the substrate 110 may be a silicon substrate. For example, a silicon wafer or a silicon on insulator (SOI) type substrate may be implemented as the substrate 110.

An insulating layer 112 may be provided on a top surface of the substrate 110 and may electrically isolate components disposed on the substrate 110 from the substrate 110. In addition, the insulating layer 112 may prevent the substrate 110 from being etched by an etching gas at the time of forming a cavity C in a process of manufacturing the bulk-acoustic wave resonator.

In this example, the insulating layer 112 may be formed of at least one of silicon dioxide ($SiO_2$), silicon nitride ($Si_3N_4$), aluminum oxide ($Al_2O_3$), and aluminum nitride (AlN), and may be formed by any one of a chemical vapor deposition (CVD) process, a radio frequency (RF) magnetron sputtering process, and an evaporation process.

The substrate 110 may be provided with external connection electrodes 114. The external connection electrodes 114 may be connected to the connection layers 130. As an example, each of the external connection electrodes 114 may include a contact portion 114a which is in contact with the connection layer 130, a connection portion 114b disposed in a via hole 116 of the substrate 110, and a bottom surface electrode portion 114c disposed on a bottom surface of the substrate 110 and extending from the connection portion 114b.

The sacrificial layer 120 may be disposed to surround the connection layer 130, and may be disposed on the insulating layer 112. Meanwhile, the cavity C disposed to be surrounded by the connection layers 130, may be formed by removing a portion of the sacrificial layer 120 during manufacturing of the bulk-acoustic wave resonator.

Additionally, the sacrificial layer 120 may be disposed to be extended from the connection layers 130.

The connection layers 130 may be disposed to surround the cavity C and may be formed on the insulating layer 112. Each of the connection layers 130 may include a first metal layer 132 formed of, for example, at least one of aluminum (Al), copper (Cu), and tungsten (W), or an alloy of at least two thereof. A top surface of the connection layer 130 may be planarized by a chemical mechanical polishing (CMP) process during manufacturing of the bulk-acoustic wave resonator. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

Additionally, each of the connection layers 130 may further include a barrier layer 134 disposed at least below the first metal layer 132 of the connection layers 130. As an example, the barrier layer 134 may form the cavity C together with the substrate 110. As an example, the barrier layer 134 may be formed of a material which is not etched by halide-based gas [for example, xenon difluoride (XeF$_2$)] for removing the sacrificial layer 120 at the time of removing the sacrificial layer 120. For example, the barrier layer 134 may be formed of at least one selected from the group consisting of manganese oxide (MnO), zirconium oxide (ZrO$_2$), aluminum nitride (AlN), lead zirconate titanate (PZT), gallium arsenide (GaAs), hafnium oxide (HfO$_2$), aluminum oxide (Al$_2$O$_3$), titanium oxide (TiO$_2$), zinc oxide (ZnO), aluminum (Al), nickel (Ni), chromium (Cr), platinum (Pt), gallium (Ga), hafnium (Hf), silicon dioxide (SiO$_2$), silicon nitride (Si$_3$N$_4$), titanium (Ti), titanium nitride (TiN), tantalum (Ta), and tantalum nitride (TaN).

The barrier layer 134 may be a film that may remain during the chemical mechanical polishing (CMP) process, and may be formed by additional deposition after the chemical mechanical polishing (CMP) process. Additionally, when the barrier layer 134 is additionally deposited after the chemical mechanical polishing (CMP) process, an additional patterning process may be performed.

When the barrier layer 134 is a metal, the connection layer 130 and the first electrode 150 may be shorted at a specific site. Therefore, in order to prevent such a short, a portion of the barrier layer 134 is removed such that the barrier layer 134 may be divided into at least two portions.

The first metal layer 132 of the connection layer 130 may be in contact with the contact portion 114a of the external connection electrode 114. Since the connection layer 130 having a thickness that may be equal to the thickness of the sacrificial layer 120 is in contact with the external connection electrode 114, swelling of the contact portion 114a of the external connection electrode 114 may be prevented. In other words, deformation of the external connection electrode 114 may be suppressed when a high power is applied to the external connection electrode 114, thereby preventing occurrence of defects.

Figure 5:
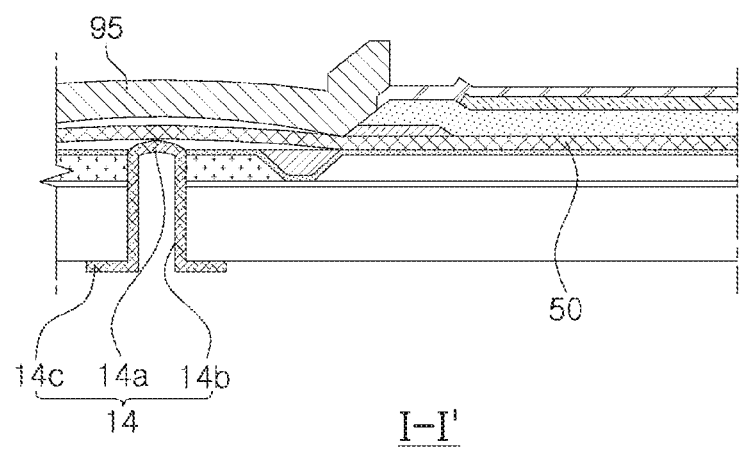
FIG. 5 is a view illustrating a swelling phenomenon of an external connection electrode in a typical bulk-acoustic wave resonator.

Referring to FIG. 5, in the typical bulk-acoustic wave resonator 10, an external connection electrode 14 and a first electrode 50 may be in contact with each other. Additionally, since a coefficient of thermal expansion of a metal pad 95 disposed on the first electrode 50 and formed of a gold (Au) material may be about three times higher than the coefficient of thermal expansion of the first electrode 50 formed of a molybdenum (Mo) material, and a thickness of the metal pad 95 may be about ten times thicker than a thickness of the first electrode 50, a contact portion 14a of the external connection electrode 14 may be swollen when a high power is applied to the external connection electrode 14, as illustrated in FIG. 5.

In particular, since the thickness of the first electrode 50 is thin, the defect of the connection portion due to a difference in the coefficient of thermal expansion between the external connection electrode 14 and the metal pad 95 may be further increased.

However, as described above in the examples, the connection layer 130 may include the first metal layer 132 formed of at least one of, for example, aluminum (Al), copper (Cu), and tungsten (W), or an alloy of at least two thereof, and the barrier layer 134 formed of, for example, at least one selected from the group consisting of, or at least one of, manganese oxide (MnO), zirconium oxide (ZrO$_2$), aluminum nitride (AlN), lead zirconate titanate (PZT), gallium arsenide (GaAs), hafnium oxide (HfO$_2$), aluminum oxide (Al$_2$O$_3$), titanium oxide (TiO$_2$), zinc oxide (ZnO), aluminum (Al), nickel (Ni), chromium (Cr), platinum (Pt), gallium (Ga), hafnium (Hf), silicon dioxide (SiO$_2$), silicon nitride (Si$_3$N$_4$), titanium (Ti), titanium nitride (TiN), tantalum (Ta), and tantalum nitride (TaN). Additionally, since the connection layer 130, which may have a thickness that is equal to a thickness of the sacrificial layer 120, may be in contact with the external connection electrode 114, swelling of the contact portion 114a of the external connection electrode 114 may be prevented even when a high power is applied to the external connection electrode 114.

In an example, the connection layer 130 may be connected to the first electrode 150 or the second electrode 170. That is, the first electrode 150 or the second electrode 170 may be connected to the top surface of the connection layer 130, and the external connection electrode 114 may be connected to a bottom surface of the connection layer 130. Accordingly, the connection layer 130 may serve as a heat transfer path. Therefore, heat generated in a resonating part, that is, an area in which all of the first electrode 150, the piezoelectric layer 160, and the second electrode 170 are disposed to be overlapped with each other, may be transferred to the connection layer 130 through the first electrode 150 or the second electrode 170, and may be transferred to the external connection electrode 114 from the connection layer 130. Accordingly, the heat may be more easily dissipated.

In particular, when the material of the connection layer 130 is silicon dioxide (SiO$_2$), thermal conductivity of the connection layer 130 is as low as 10 W/mK, so that effective heat dissipation may be problematic. However, when the material of the connection layer 130 is a metal material such as aluminum (Al), copper (Cu), or tungsten (W), the connection layer 130 may have high thermal conductivity as compared to silicon dioxide (SiO$_2$), thereby resulting in effective heat dissipation.

TABLE 1

| Material | Thermal Conductivity (W/mK) |
| --- | --- |
| Al | 237 |
| Cu | 401 |
| W | 173 |
| Mo | 138 |
| SiO$_2$ | 10 |
| Si$_3$N$_4$ | 30 |
| Poly Si | 149 |

At least a portion of the first electrode 150 may be disposed on the connection layer 130. Specifically, in an example, a portion of the first electrode 150 may be disposed on the cavity C, and at least a portion of the remaining portion of the first electrode 150 may be disposed on the connection layer 130.

As an example, the first electrode 150 may be formed of a conductive material such as molybdenum (Mo), ruthenium (Ru), tungsten (W), iridium (Ir), or platinum (Pt), or alloys thereof.

Additionally, the first electrode 150 may be used as any one of an input electrode inputting an electrical signal such as a radio frequency (RF) signal, or the like, and an output electrode. For example, in an example in which the first electrode 150 is the input electrode, the second electrode 170 may be the output electrode, and in an example in which the first electrode 150 is the output electrode, the second electrode 170 may be the input electrode.

The piezoelectric layer 160 may be disposed to cover at least a portion of the first electrode 150. Additionally, the piezoelectric layer 160 may convert the signals input through the first electrode 150 or the second electrode 170 into elastic waves. That is, the piezoelectric layer 160 may serve to convert the electrical signals into the elastic waves by physical vibrations.

As an example, the piezoelectric layer 160 may be formed by depositing aluminum nitride, doped aluminum nitride, zinc oxide, or lead zirconate titanate.

Additionally, the piezoelectric layer 160 of aluminum nitride (AlN) may further include a rare earth metal. As an example, the rare earth metal may include at least one of scandium (Sc), erbium (Er), yttrium (Y), and lanthanum (La). Additionally, the piezoelectric layer 160 of aluminum nitride (AlN) may further include a transition metal. As an example, the transition metal may include at least one of zirconium (Zr), titanium (Ti), magnesium (Mg), and hafnium (Hf). Additionally, the transition metal may also include magnesium (Mg), which is a divalent metal.

Meanwhile, the piezoelectric layer 160 may include a piezoelectric portion 162 disposed in a flat portion S and a bent portion 164 disposed in an extension portion E.

The piezoelectric portion 162 may be a portion directly stacked on an upper surface of the first electrode 150. Therefore, the piezoelectric portion 162 may be interposed between the first electrode 150 and the second electrode 170 and may be formed in a flat shape together with the first electrode 150 and the second electrode 170.

The bent portion 164 may refer to a region extended outwardly from the piezoelectric portion 162 and positioned in the extension portion E.

The bent portion 164 may be disposed on an insertion layer 180 to be described below, and may protrude along a shape of the insertion layer 180. Therefore, the piezoelectric layer 160 may be bent at a boundary between the piezoelectric portion 162 and the bent portion 164, and the bent portion 164 may protrude depending on a thickness and a shape of the insertion layer 180.

The bent portion 164 may be divided into an inclined portion 164a and an extended portion 164b.

The inclined portion 164a may refer to a portion inclined along an inclined surface L of an insertion layer 180 to be described below. Additionally, the extended portion 164b may refer to a portion extended outwardly from the inclined portion 164a.

The inclined portion 164a may be formed in parallel with the inclined surface L of the insertion layer 180, and an inclined angle of the inclined portion 164a may be the same as an inclined angle θ (see FIG. 3) of the inclined surface L of the insertion layer 180.

The second electrode 170 may be disposed to at least cover the piezoelectric layer 160 disposed on the cavity C. The second electrode 170 may be used as any one of an input electrode inputting an electrical signal such as a radio frequency (RF) signal, or the like, and an output electrode. That is, in an example in which the first electrode 150 is used as the input electrode, the second electrode 170 may be used as the output electrode, and in an example in which the first electrode 150 is used as the output electrode, the second electrode 170 may be used as the input electrode.

As an example, the second electrode 170 may be formed of a conductive material such as molybdenum (Mo), ruthenium (Ru), tungsten (W), iridium (Ir), or platinum (Pt), or alloys thereof, similarly to the first electrode 150.

The insertion layer 180 may be disposed between the first electrode 150 and the piezoelectric layer 160. The insertion layer 180 may be formed of a dielectric substance such as silicon dioxide ($SiO_2$), aluminum nitride (AlN), aluminum oxide ($Al_2O_3$), silicon nitride ($Si_3N_4$), manganese oxide (MnO), zirconium oxide ($ZrO_2$), lead zirconate titanate (PZT), gallium arsenide (GaAs), hafnium oxide ($HfO_2$), titanium oxide ($TiO_2$), zinc oxide (ZnO), or the like, but may be formed of a material different from a material of the piezoelectric layer 160. Additionally, a region in which the insertion layer 180 is provided may be an empty space, if necessary. Such an empty space may be implemented by removing the insertion layer 180 in the manufacturing process.

In an example, the material of the insertion layer 180 may also be a metal material. Since a dry etching or wet etching selection ratio with the first electrode 150 should be derived, a material different from a material of the first electrode 150 may be used as the material of the insertion layer 180. For example, alloys of aluminum (Al), titanium (Ti), tungsten (W), ruthenium (Ru), chromium (Cr), platinum (Pt), molybdenum (Mo), iridium (Ir), copper (Cu), nickel (Ni), tantalum (Ta), and cobalt (Co) may be used.

In the present example, the insertion layer 180 may be formed to have a thickness that is equal to a thickness of the first electrode 150. In an example, the insertion layer 180 may be formed to have a thickness equal to or less than a thickness of the piezoelectric layer 160. For example, the insertion layer 180 may be formed to have a thickness of 100 Å or more, and may be formed to have a thickness smaller than that of the piezoelectric layer 160.

When the thickness of the insertion layer is 100 Å or less, it may be difficult to form the inclined surface, and when the thickness of the insertion layer is greater than the thickness of the piezoelectric layer 160, it may be difficult for the piezoelectric layer 160 to pass over the insertion layer 180, which may cause defects such as cracks.

In an example, the insertion layer 180 may be disposed along a surface formed by a membrane layer 140, the first electrode 150, and an etching preventing portion 130.

The insertion layer 180 may be disposed in the vicinity of the flat portion S (for example, FIG. 2) and may support the bent portion 164 of the piezoelectric layer 160. Therefore, the bent portion 164 of the piezoelectric layer 160 may be divided into the inclined portion 164a and the extended portion 164b depending on the shape of the insertion layer 180.

The insertion layer 180 may be disposed in a region other than the flat portion S. For example, the insertion layer 180 may be disposed in the entirety of the region other than the flat portion S, or may be disposed in a portion of the region other than the flat portion S.

In an example, at least a portion of the insertion layer 180 may be disposed between the piezoelectric layer 160 and the first electrode 150.

A side surface of the insertion layer 180 disposed along a boundary of the flat portion S may have a form in which a thickness thereof increases as a distance from the flat portion S increases. Therefore, the side surface of the insertion layer 180 disposed adjacently to the flat portion S may be the inclined surface L having a predetermined inclined angle θ.

When the inclined angle θ of the side surface of the insertion layer 180 is smaller than 5°, a thickness of the insertion layer 180 should be very small or an area of the inclined surface L should be excessively large in order to manufacture the insertion layer 180 of which the inclined angle θ of the side surface is smaller than 5°, which is substantially difficult to be implemented.

Additionally, when the inclined angle θ of the side surface of the insertion layer 180 is greater than 70°, an inclined angle of the inclined portion 164a of the piezoelectric layer 160 stacked on the insertion layer 180 may also be greater than 70°. In this example, since the piezoelectric layer 160 is excessively bent, a crack may be generated in the bent portion of the piezoelectric layer 160.

Therefore, in the example, the inclined angle θ of the inclined surface L may be in a range of 5° or more to 70° or less.

The passivation layer 190 may be disposed in a region overlapping portions of the first electrode 150 and the second electrode 170. In an example, the passivation layer 190 may serve to prevent damage to the second electrode 170 and the first electrode 150 during the manufacturing process.

Furthermore, the passivation layer 190 may be partially removed by etching for frequency adjustment in the final manufacturing process. That is, a thickness of the passivation layer 190 may be adjusted. As the passivation layer 190, a dielectric layer containing at least one selected from the group consisting of, or at least one of, for example, silicon nitride ($Si_3N_4$), silicon dioxide ($SiO_2$), manganese oxide (MnO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and a zinc oxide (ZnO) may be used.

The metal pads 195 may be formed on portions of the first electrode 150 and the second electrode 170 on which the passivation layer 190 is not formed. As an example, the metal pad 195 may be formed of a material such as, but not limited to, gold (Au), a gold-tin (Au—Sn) alloy, copper (Cu), a copper-tin (Cu—Sn) alloy, aluminum (Al), an aluminum alloy, or the like. For example, the aluminum alloy may be an aluminum-germanium (Al—Ge) alloy.

As described above, the swelling of the contact portion 114a of the external connection electrode 114 may be prevented by the connection layer 130.

Additionally, heat generated in a resonating part, that is, a region in which all of the first electrode 150, the piezoelectric layer 160, and the second electrode 170 are disposed to be overlapped with each other may be transferred to the connection layer 130 through the first electrode 150 or the second electrode 170, and may be transferred to the external connection electrode 114 from the connection layer 130. As described above, the heat may be transferred to the connection layer 130 which may have a thickness that is equal to a thickness of the sacrificial layer 120 to increase a heat dissipation path, and as a result, the heat generated in the resonating part may be more easily dissipated to the outside.

Other examples will hereinafter be described with reference to the drawings. The same components as the above-mentioned components will be denoted by the same reference numerals, and a detailed description thereof will be omitted.

Figure 6:
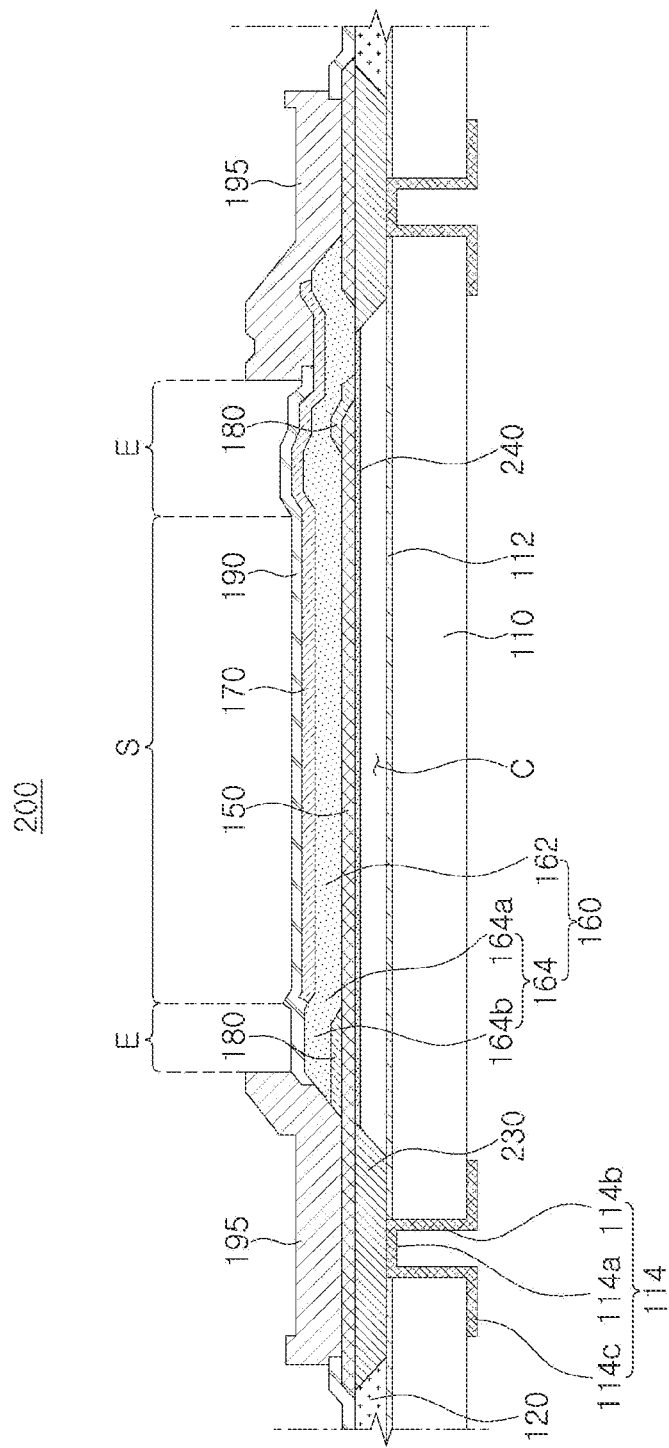
FIG. 6 is a schematic cross-sectional view illustrating an example of a bulk-acoustic wave resonator.

FIG. 6 is a schematic cross-sectional view illustrating a bulk-acoustic wave resonator according to another example.

Referring to FIG. 6, a bulk-acoustic wave resonator 200 may include, for example, the substrate 110, the sacrificial layer 120, connection layers 230, a membrane layer 240, the first electrode 150, the piezoelectric layer 160, the second electrode 170, the insertion layer 180, the passivation layer 190, and the metal pads 195.

Since the substrate 110, the sacrificial layer 120, the first electrode 150, the piezoelectric layer 160, the second electrode 170, the insertion layer 180, the passivation layer 190, and the metal pads 195 are the same components as the components described above, a detailed description thereof will be omitted and will be replaced by the above description.

The connection layers 230 may be disposed to surround the cavity C and may be formed on the insulating layer 112. Each of the connection layers 230 may be formed of, for example, at least one selected from the group consisting of, or at least one of, aluminum (Al), copper (Cu), and tungsten (W), or an alloy of at least two thereof.

The connection layer 230 may be in contact with the contact portion 114a of the external connection electrode 114. Since the connection layer 230 having a thickness equal to the thickness of the sacrificial layer 120 may be in contact with the external connection electrode 114, swelling of the contact portion 114a of the external connection electrode 114 may be prevented. In other words, deformation of the external connection electrode 114 may be suppressed when a high power is applied to the external connection electrode 114, thereby preventing the occurrence of defects.

This will be described in more detail. Typically, as illustrated in FIG. 5, an external connection electrode 14 and a first electrode 50 may be in contact with each other. Additionally, since a coefficient of thermal expansion of a metal pad 95 disposed on the first electrode 50 and formed of a gold (Au) material is about three times higher than a coefficient of thermal expansion of the first electrode 50 formed of a molybdenum (Mo) material, and a thickness of the metal pad 95 is about ten times thicker than a thickness of the first electrode 50, a contact portion 14a of the external connection electrode 14 may be swollen when a high power is applied to the external connection electrode 14, as illustrated in FIG. 5.

However, referring to FIG. 6, and as described above, each of the connection layers 230 may be formed of at least one selected from the group consisting of, or at least one of, aluminum (Al), copper (Cu), and tungsten (W), or an alloy of at least two thereof. In addition, since the connection layer 230 having the thickness equal to the thickness of the sacrificial layer 120 may be in contact with the external connection electrode 114, the swelling of the contact portion 114a of the external connection electrode 114 may be prevented when a high power is applied to the external connection electrode 114.

The connection layer 230 may be connected to the first electrode 150 or the second electrode 170. That is, the first electrode 150 or the second electrode 170 may be connected to the top surface of the connection layer 230, and the external connection electrode 114 may be connected to the bottom surface of the connection layer 230. Accordingly, the connection layer 230 may serve as a heat transfer path.

Therefore, heat generated in a resonating region, that is, a region in which all of the first electrode 150, the piezoelectric layer 160, and the second electrode 170 are disposed to be overlapped with each other, may be transferred to the connection layer 230 through the first electrode 150 or the second electrode 170, and may be transferred to the external connection electrode 114 from the connection layer 230. Accordingly, the heat may be more easily dissipated.

The membrane layer 240 may be disposed to cover the cavity C. As an example, the membrane layer 240 may be formed of a material having low reactivity with the etching gas. In this case, the membrane layer 240 may include at least one of silicon dioxide ($SiO_2$) and silicon nitride ($Si_3N_4$), but is not limited thereto.

In an example, the membrane layer 240 may be a dielectric layer containing at least one selected from the group consisting of, or at least one of, but not limited to, a manganese oxide (MnO), a zirconium oxide ($ZrO_2$), an aluminum nitride (AlN), a lead zirconate titanate (PZT), a gallium arsenide (GaAs), a hafnium oxide ($HfO_2$), an aluminum oxide ($Al_2O_3$), a titanium oxide ($TiO_2$), and a zinc oxide (ZnO), or may be a metal layer containing at least one selected from the group consisting of, or at least one of, aluminum (Al), nickel (Ni), chromium (Cr), platinum (Pt), gallium (Ga), hafnium (Hf), and titanium (Ti).

A seed layer (not illustrated) formed of, for example, aluminum nitride (AlN), may be formed on the membrane layer 240. Specifically, the seed layer may be disposed between the membrane layer 240 and the first electrode 150. The seed layer may be formed with a dielectric substance or a metal having a hexagonal close packed (HCP) structure in addition to AlN. When the seed layer is formed of the metal, the seed layer may be formed of, for example, at least one of titanium (Ti), titanium nitride (TiN), tantalum (Ta), and tantalum nitride (TaN).

Figure 7:
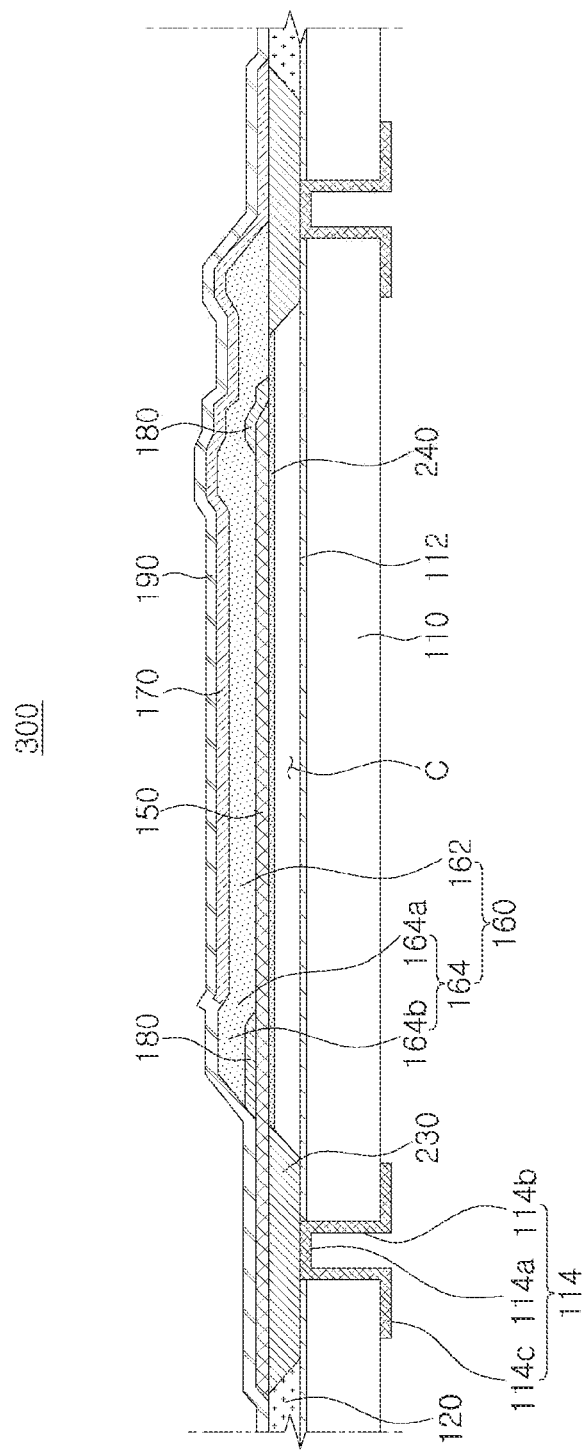
FIG. 7 is a schematic cross-sectional view illustrating an example of a bulk-acoustic wave resonator.

FIG. 7 is a schematic cross-sectional view illustrating a bulk-acoustic wave resonator according to another example.

Referring to FIG. 7, a bulk-acoustic wave resonator 300 according to an example may include, for example, the substrate 110, the sacrificial layer 120, the connection layers 230, the membrane layer 240, the first electrode 150, the piezoelectric layer 160, the second electrode 170, the insertion layer 180, and the passivation layer 190.

The metal pads 195 (see FIG. 1) may be removed from the bulk-acoustic wave resonator 300. Accordingly, in a filter apparatus (not illustrated) including a plurality of bulk-acoustic wave resonators 300, a gap between the adjacent bulk-acoustic wave resonators 300 may be narrowed. Therefore, insertion loss (IL) characteristics of the filter apparatus including the plurality of bulk-acoustic wave resonators 300 may be improved, and a size of the filter apparatus may be reduced.

Figure 8:
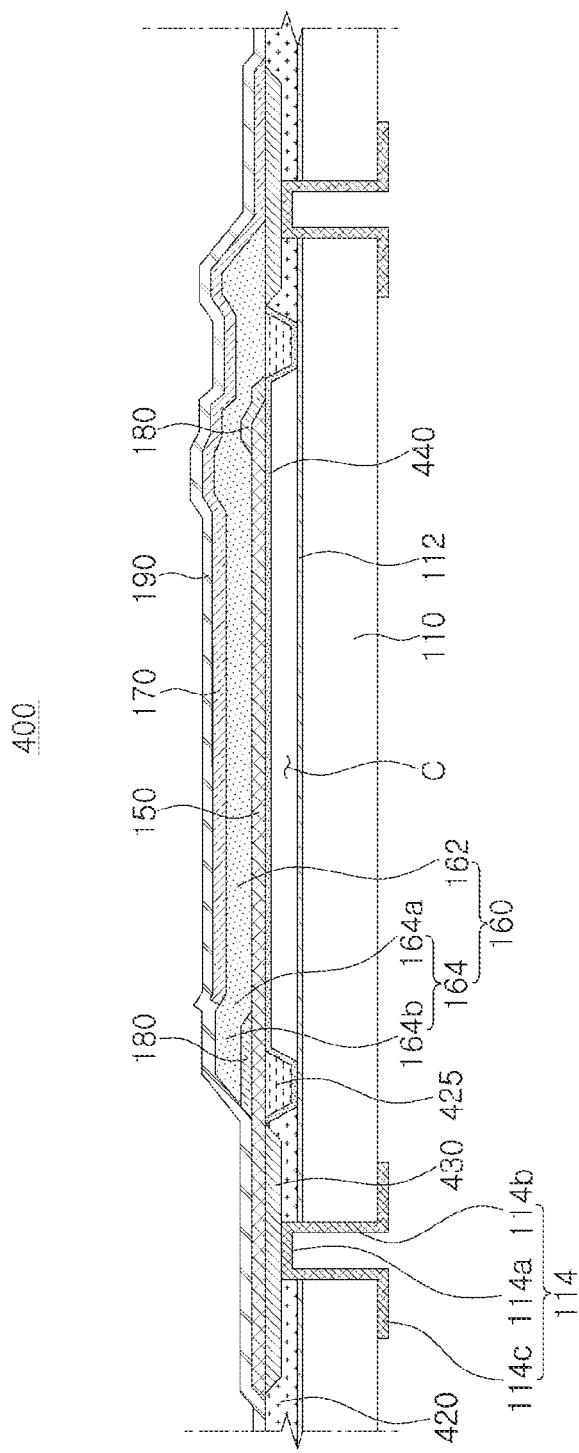
FIG. 8 is a schematic cross-sectional view illustrating an example of a bulk-acoustic wave resonator.

FIG. 8 is a schematic cross-sectional view illustrating a bulk-acoustic wave resonator according to another example.

Referring to FIG. 8, a bulk-acoustic wave resonator 400 according to an example may include, for example, the substrate 110, a sacrificial layer 420, an etching preventing layer 425, connection layers 430, a membrane layer 440, the first electrode 150, the piezoelectric layer 160, the second electrode 170, the insertion layer 180, and the passivation layer 190.

The sacrificial layer 420 may be formed on the insulating layer 112, and the cavity C and the etching preventing layer 425 may be disposed in the sacrificial layer 420. The cavity C may be formed by removing a portion of the sacrificial layer 420 at the time of manufacturing the bulk-acoustic wave resonator. As described above, as the cavity C may be formed in the sacrificial layer 420, the first electrode 150 formed on the sacrificial layer 420 may be flat.

The etching preventing layer 425 may be disposed along a boundary of the cavity C. The etching preventing layer 425 may prevent etching from being performed beyond a cavity region in a process of forming the cavity C.

The connection layer 430 may be disposed to be buried in the sacrificial layer 420. Meanwhile, each of the connection layers 430 may be formed of, for example, at least one selected from the group consisting of, or at least one of, but not limited to, aluminum (Al), copper (Cu), and tungsten (W), or an alloy of at least two thereof.

The connection layer 430 may be in contact with the contact portion 114a of the external connection electrode 114. As described above, since the connection layer 430 may have a thickness that is equal to half the thickness of the sacrificial layer 420, as compared to the thickness of the sacrificial layer 420, may be in contact with the external connection electrode 114, swelling of the contact portion 114a of the external connection electrode 114 may be prevented. In other words, deformation of the external connection electrode 114 may be suppressed when a high power is applied to the external connection electrode 114, thereby preventing an occurrence of defects.

This will be described in more detail. Typically, referring to FIG. 5, an external connection electrode 14 and a first electrode 50 may be in contact with each other. Additionally, since a coefficient of thermal expansion of a metal pad 95 disposed on the first electrode 50 and formed of a gold (Au) material is about three times higher than a coefficient of thermal expansion of the first electrode 50 formed of a molybdenum (Mo) material, and a thickness of the metal pad 95 is about ten times thicker than a thickness of the first electrode 50, a contact portion 14a of the external connection electrode 14 may be swollen when a high power is applied to the external connection electrode 14, as illustrated in FIG. 5.

However, as described above, and with reference to FIG. 8, each of the connection layers 430 may be formed of at least one selected from the group consisting of, or at least one of, but not limited to, aluminum (Al), copper (Cu), and tungsten (W), or an alloy of at least two thereof. Additionally, the connection layer 430 which may have a thickness equal to half of the thickness of the sacrificial layer 420 as compared to the thickness of the sacrificial layer 420, may be in contact with the external connection electrode 114, the swelling of the contact portion 114a of the external connection electrode 114 may be prevented when a high power is applied to the external connection electrode 114.

The connection layer 430 may be connected to the first electrode 150 or the second electrode 170. That is, the first electrode 150 or the second electrode 170 may be connected to the top surface of the connection layer 430, and the external connection electrode 114 may be connected to the bottom surface of the connection layer 430. Accordingly, the connection layer 430 may serve as a heat transfer path. Therefore, heat generated in a resonating region, that is, a region in which the first electrode 150, the piezoelectric layer 160, and the second electrode 170 are disposed to be overlapped with each other, may be transferred to the connection layer 430 through the first electrode 150 or the second electrode 170, and may be transferred to the external connection electrode 114 from the connection layer 430. Accordingly, the heat may be more easily dissipated.

The metal pads 195 (see FIG. 1) may be removed from the bulk-acoustic wave resonator 400. Accordingly, in a filter apparatus (not illustrated) including a plurality of bulk-acoustic wave resonators 400, a gap between the adjacent bulk-acoustic wave resonators 400 may be narrowed. Therefore, insertion loss (IL) characteristics of the filter apparatus including the plurality of bulk-acoustic wave resonators 400 may be improved, and a size of the filter apparatus may be reduced.

Figure 9:
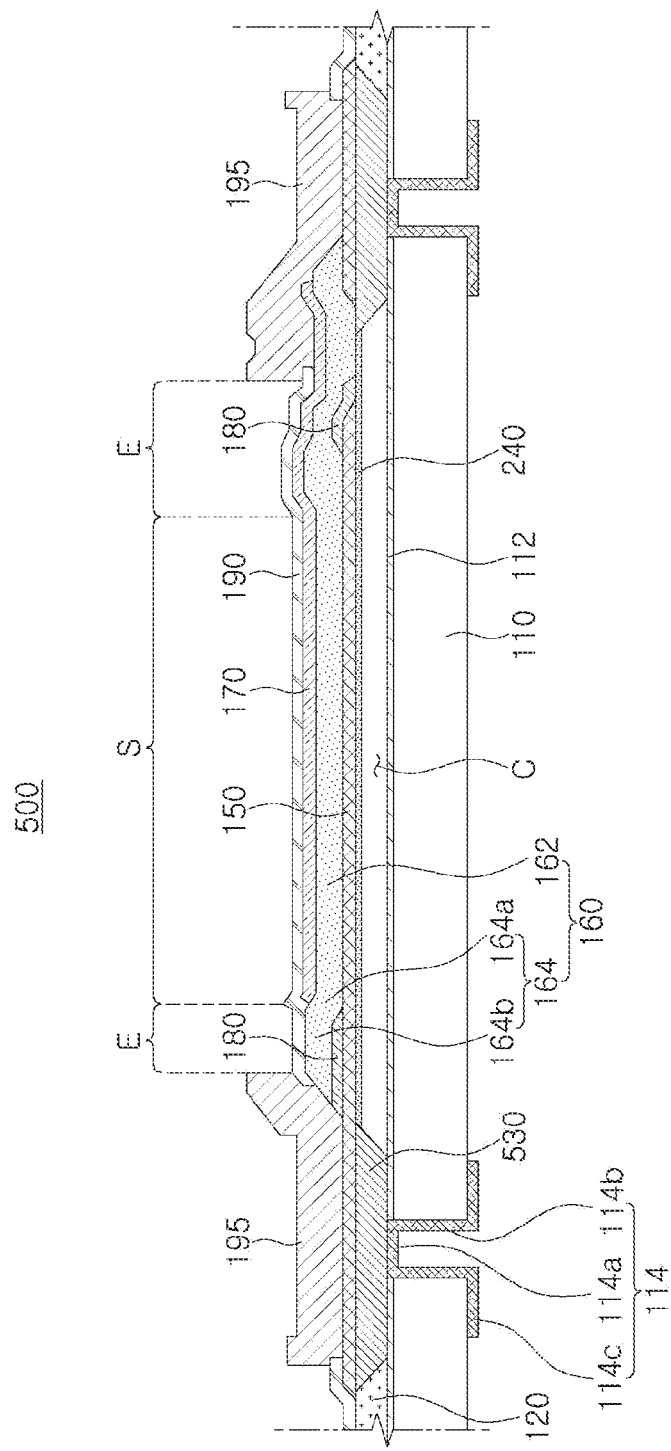
FIG. 9 is a schematic cross-sectional view illustrating an example of a bulk-acoustic wave resonator.

FIG. 9 is a schematic cross-sectional view illustrating a bulk-acoustic wave resonator according to another example.

Referring to FIG. 9, a bulk-acoustic wave resonator 500 may include, for example, the substrate 110, the sacrificial layer 120, connection layers 530, the membrane layer 240, the first electrode 150, the piezoelectric layer 160, the second electrode 170, the insertion layer 180, the passivation layer 190, and the metal pads 195.

Since the substrate 110, the sacrificial layer 120, the membrane layer 240, the first electrode 150, the piezoelectric layer 160, the second electrode 170, the insertion layer 180, the passivation layer 190, and the metal pads 195 are the same components as the components described above, a detailed description thereof will be omitted and will be replaced by the above description.

The connection layers 530 may be disposed to surround the cavity C, and may be formed on the insulating layer 112. The connection layer 530 may be formed of, for example, an alloy of copper (Cu) and tungsten (W).

When the connection layer 530 is formed of the alloy of copper (Cu) and tungsten (W), the connection layer 530 may exhibit better thermal conductivity and electrical conductivity characteristics as compared to an example in which the connection layer 530 is formed of tungsten (W).

In an example, the content of copper (Cu) in the alloy of copper (Cu) and tungsten (W) may be 10 at % or more. When the content of copper (Cu) is 10 at % or less, it may be difficult to improve thermal conductivity and electrical conductivity characteristics as compared to tungsten (W). Additionally, the content of copper (Cu) in the alloy of copper (Cu) and tungsten (W) may be 40 at % or less. When the content of copper (Cu) in the alloy of copper (Cu) and tungsten (W) is 40 at % or more, it may be difficult to perform uniform planarization during a chemical mechanical polishing (CMP) process of the connection layer 530, and it may be difficult to implement a uniform thin film due to serious unevenness of a composition during a deposition of the connection layer 530.

In an example, the connection layer 530 may be in contact with the contact portion 114a of the external connection electrode 114. Since the connection layer 530, which has a thickness equal to the thickness of the sacrificial layer 120, may be in contact with the external connection electrode 114, swelling of the contact portion 114a of the external connection electrode 114 may be prevented. In other words, deformation of the external connection electrode 114 may be suppressed when a high power is applied to the external connection electrode 114, thereby preventing occurrence of defects.

This will be described in more detail. Typically, as illustrated in FIG. 5, an external connection electrode 14 and a first electrode 50 may be in contact with each other. Additionally, since a coefficient of thermal expansion of a metal pad 95 disposed on the first electrode 50 is about three times higher than a coefficient of thermal expansion of the first electrode 50, and a thickness of the metal pad 95 is about ten times thicker than a thickness of the first electrode 50, a contact portion 14a of the external connection electrode 14 may be swollen when a high power is applied to the external connection electrode 14, as illustrated in FIG. 5.

However, as described above, since the connection layer 530 having a thickness equal to a thickness of the sacrificial layer 120 may be in contact with the external connection electrode 114, the swelling of the contact portion 114a of the external connection electrode 114 may be prevented when a high power is applied to the external connection electrode 114.

The connection layer 530 may be connected to the first electrode 150 or the second electrode 170. That is, the first electrode 150 or the second electrode 170 may be connected to the top surface of the connection layer 530, and the external connection electrode 114 may be connected to the bottom surface of the connection layer 530. Accordingly, the connection layer 530 may serve as a heat transfer path. Therefore, heat generated in a resonating part, that is, a region in which all of the first electrode 150, the piezoelectric layer 160, and the second electrode 170 are disposed to be overlapped with each other may be transferred to the connection layer 530 through the first electrode 150 or the second electrode 170, and may be transferred to the external connection electrode 114 from the connection layer 530. Accordingly, the heat may be more easily dissipated.

Figure 10:
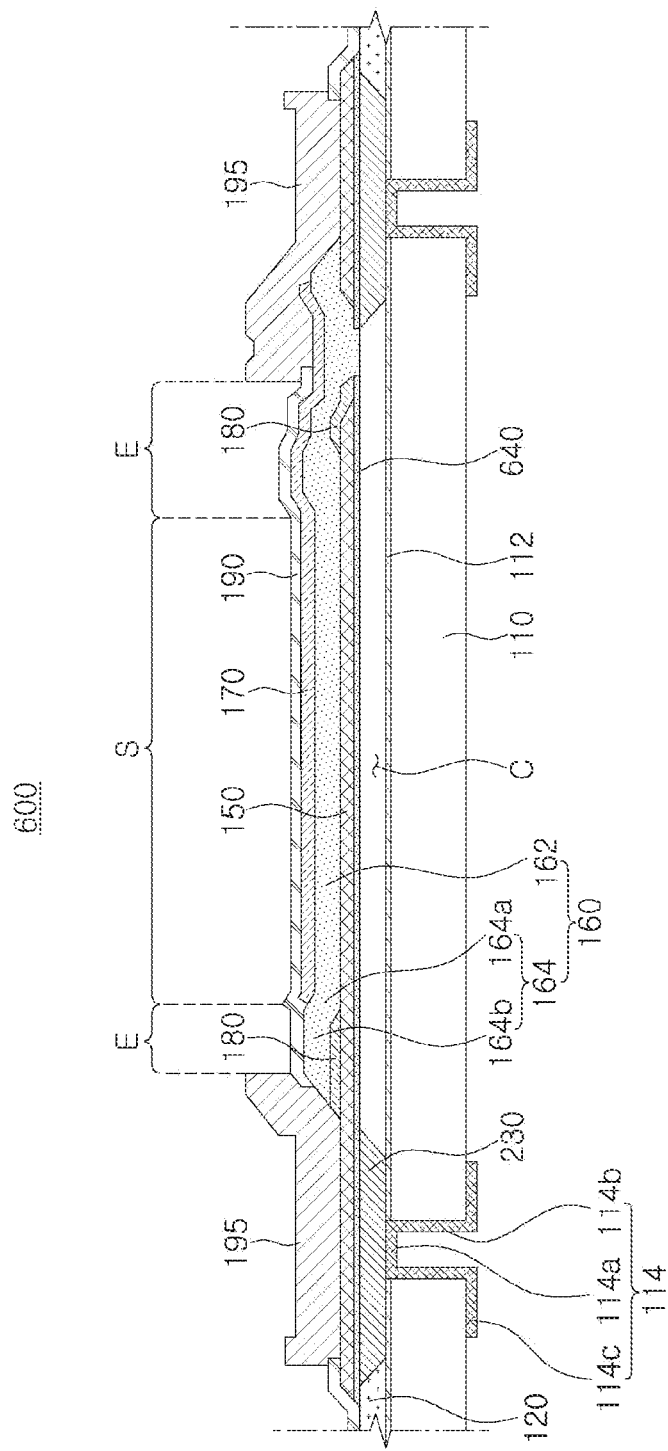
FIG. 10 is a schematic cross-sectional view illustrating an example of a bulk-acoustic wave resonator.

FIG. 10 is a schematic cross-sectional view illustrating a bulk-acoustic wave resonator according to another example.

Referring to FIG. 10, a bulk-acoustic wave resonator 600 according to an example may include, for example, the substrate 110, the sacrificial layer 120, the connection layers 230, a seed layer 640, the first electrode 150, the piezoelectric layer 160, the second electrode 170, the insertion layer 180, the passivation layer 190, and the metal pads 195.

The seed layer 640 may cover at least the connection layer 230. Specifically, the seed layer 640 may be disposed between the connection layer 230 and the first electrode 150. As an example, the seed layer 640 may be formed using a dielectric substance or a metal having a hexagonal close packed (HCP) structure in addition to AlN. When the seed layer 640 is formed of the metal, the seed layer 640 may be formed of, for example, at least one of titanium (Ti), titanium nitride (TiN), tantalum (Ta), and tantalum nitride (TaN). The seed layer 640 may also be formed of aluminum nitride (AlN).

Figure 11:
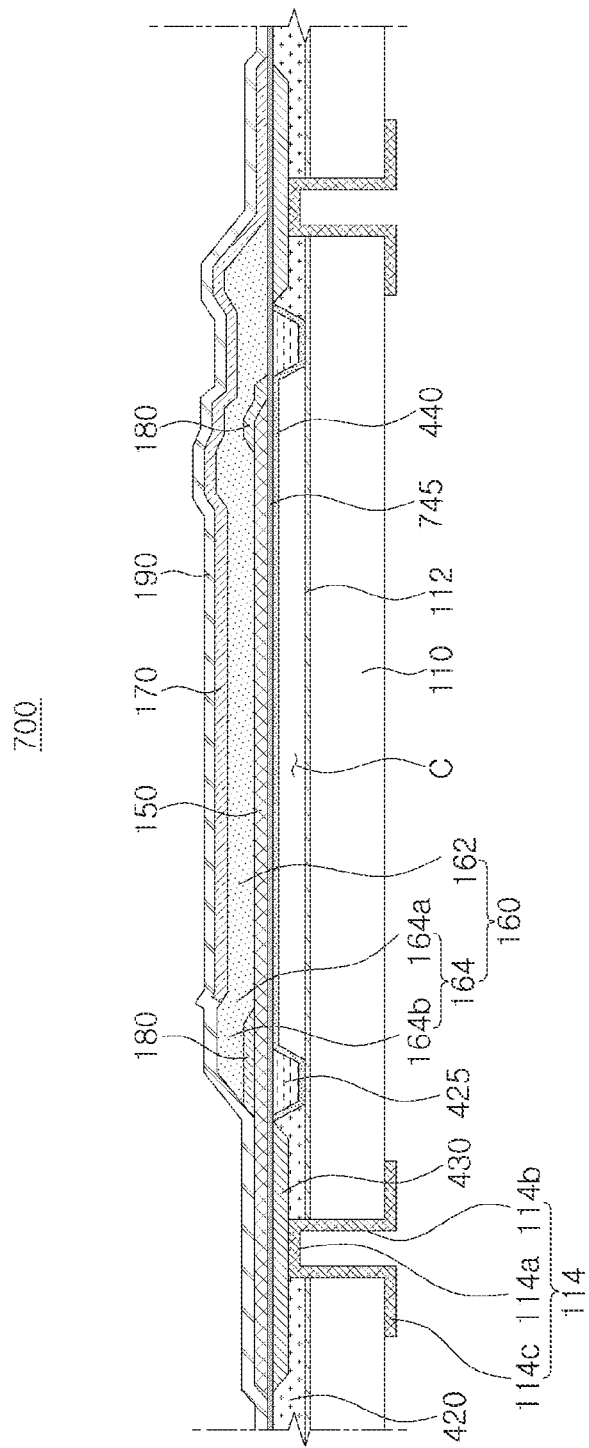
FIG. 11 is a schematic cross-sectional view illustrating an example of a bulk-acoustic wave resonator.

FIG. 11 is a schematic cross-sectional view illustrating a bulk-acoustic wave resonator according to another example.

Referring to FIG. 11, a bulk-acoustic wave resonator 700 according to an example may include, for example, the substrate 110, the sacrificial layer 420, the etching preventing layer 425, the connection layers 430, the membrane layer 440, a seed layer 745, the first electrode 150, the piezoelectric layer 160, the second electrode 170, the insertion layer 180, and the passivation layer 190.

The seed layer 745 may cover at least the connection layer 430. Specifically, the seed layer 745 may be disposed between the connection layer 430 and the first electrode 150. As an example, the seed layer 745 may be formed using a dielectric substance or a metal having a hexagonal close packed (HCP) structure in addition to AlN. When the seed layer 745 is formed of the metal, the seed layer 745 may be formed of, for example, at least one of titanium (Ti), titanium nitride (TiN), tantalum (Ta), and tantalum nitride (TaN). The seed layer 745 may also be formed of aluminum nitride (AlN).

Figure 12:
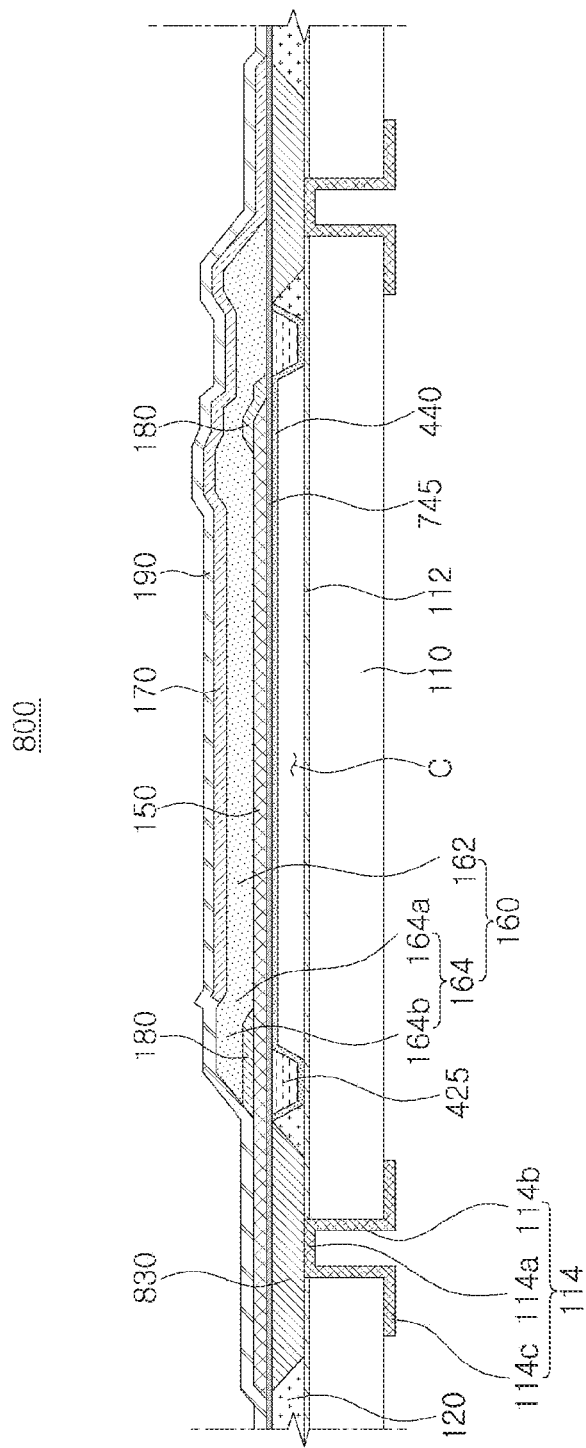
FIG. 12 is a schematic cross-sectional view illustrating an example of a bulk-acoustic wave resonator.

FIG. 12 is a schematic cross-sectional view illustrating a bulk-acoustic wave resonator according to another example.

Referring to FIG. 12, a bulk-acoustic wave resonator 800 according to an example may include, for example, the substrate 110, the sacrificial layer 120, the etching preventing layer 425, connection layers 830, the membrane layer 440, the seed layer 745, the first electrode 150, the piezoelectric layer 160, the second electrode 170, the insertion layer 180, and the passivation layer 190.

The connection layer 830 may be disposed to be inserted into the sacrificial layer 420. Meanwhile, each of the connection layers 830 may be formed of, for example, at least one selected from the group consisting of, or at least one of, but not limited to, aluminum (Al), copper (Cu), and tungsten (W), or an alloy of at least two thereof. In an example, the connection layer 830 may have a thickness corresponding to a thickness of the sacrificial layer 120.

The connection layer 830 may be in contact with the contact portion 114a of the external connection electrode 114. Since the connection layer 830 having a thickness equal to the thickness of the sacrificial layer 120 may be in contact with the external connection electrode 114, swelling of the contact portion 114a of the external connection electrode 114 may be prevented. In other words, deformation of the external connection electrode 114 may be suppressed when a high power is applied to the external connection electrode 114, thereby preventing occurrence of defects.

The connection layer 830 may be connected to the first electrode 150 or the second electrode 170. That is, the first electrode 150 or the second electrode 170 may be connected to the top surface of the connection layer 830, and the external connection electrode 114 may be connected to the bottom surface of the connection layer 830. Accordingly, the connection layer 830 may serve as a heat transfer path. Therefore, heat generated in a resonating region, that is, a region in which all of the first electrode 150, the piezoelectric layer 160, and the second electrode 170 are disposed to be overlapped with each other, may be transferred to the connection layer 830 through the first electrode 150 or the second electrode 170, and may be transferred to the external connection electrode 114 from the connection layer 830. Accordingly, the heat may be more easily dissipated.

As set forth above, according to the examples, reliability may be improved and the heat dissipation efficiency may be improved.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk-acoustic wave resonator comprising:
a connection layer disposed on a substrate;
a first electrode disposed to cover at least a portion of the connection layer;
a piezoelectric layer disposed to cover at least a portion of the first electrode; and
a second electrode disposed to cover at least a portion of the piezoelectric layer,
wherein the connection layer is disposed to surround a cavity, and is disposed to be connected to at least one of the first electrode and the second electrode, and
wherein the connection layer comprises a first metal layer containing at least one of aluminum (Al), copper (Cu), and tungsten (W).

2. The bulk-acoustic wave resonator of claim 1, further comprising a substrate comprising an external connection electrode,
wherein the connection layer is connected to the external connection electrode.

3. The bulk-acoustic wave resonator of claim 1, wherein the connection layer further comprises a barrier layer disposed at least below the first metal layer.

4. The bulk-acoustic wave resonator of claim 3, wherein the barrier layer is formed of at least one of manganese oxide (MnO), zirconium oxide (ZrO$_2$), aluminum nitride (AlN), lead zirconate titanate (PZT), gallium arsenide (GaAs), hafnium oxide (HfO$_2$), aluminum oxide (Al$_2$O$_3$), titanium oxide (TiO$_2$), zinc oxide (ZnO), aluminum (Al), nickel (Ni), chromium (Cr), platinum (Pt), gallium (Ga), hafnium (Hf), silicon dioxide (SiO$_2$), silicon nitride (Si$_3$N$_4$), titanium (Ti), titanium nitride (TiN), tantalum (Ta), and tantalum nitride (TaN).

5. The bulk-acoustic wave resonator of claim 1, further comprising a sacrificial layer disposed to be extended from the connection layer.

6. The bulk-acoustic wave resonator of claim 1, further comprising metal pads connected to the connection layer.

7. The bulk-acoustic wave resonator of claim 1, further comprising a seed layer disposed on at least a top surface of the connection layer.

8. The bulk-acoustic wave resonator of claim 7, wherein the seed layer is formed of a material containing at least one of titanium (Ti), titanium nitride (TiN), tantalum (Ta), and tantalum nitride (TaN).

9. The bulk-acoustic wave resonator of claim 1, further comprising an insertion layer disposed between the first electrode and the piezoelectric layer.

10. A bulk-acoustic wave resonator comprising:
a substrate;
an etching preventing layer disposed on the substrate and disposed to surround a cavity;
a sacrificial layer disposed to surround the etching preventing layer;
a connection layer disposed in the sacrificial layer;
a first electrode which has a portion connected to the connection layer;
a piezoelectric layer which has at least a portion disposed to cover the first electrode; and
a second electrode disposed to cover at least a portion of the piezoelectric layer,
wherein the connection layer is connected to the first electrode and the second electrode.

11. The bulk-acoustic wave resonator of claim 10, further comprising an external connection electrode connected to the connection layer, and disposed to penetrate through the substrate and the sacrificial layer.

12. The bulk-acoustic wave resonator of claim 10, wherein the connection layer comprises a first metal layer containing at least one of aluminum (Al), copper (Cu), and tungsten (W).

13. The bulk-acoustic wave resonator of claim 12, wherein the connection layer further comprises a barrier layer disposed below at least the first metal layer.

14. The bulk-acoustic wave resonator of claim 13, wherein the barrier layer is formed of at least one of manganese oxide (MnO), zirconium oxide (ZrO$_2$), aluminum nitride (AlN), lead zirconate titanate (PZT), gallium arsenide (GaAs), hafnium oxide (HfO$_2$), aluminum oxide (Al$_2$O$_3$), titanium oxide (TiO$_2$), zinc oxide (ZnO), aluminum (Al), nickel (Ni), chromium (Cr), platinum (Pt), gallium (Ga), hafnium (Hf), silicon dioxide (SiO$_2$), silicon nitride (Si$_3$N$_4$), titanium (Ti), titanium nitride (TiN), tantalum (Ta), and tantalum nitride (TaN).

15. The bulk-acoustic wave resonator of claim 10, further comprising a seed layer disposed at least on a top surface of the connection layer.

16. The bulk-acoustic wave resonator of claim 15, wherein the seed layer is formed of a material containing at least one of titanium (Ti), titanium nitride (TiN), tantalum (Ta), and tantalum nitride (TaN).

17. The bulk-acoustic wave resonator of claim 10, wherein the connection layer has a thickness corresponding to a thickness of the sacrificial layer.

18. A bulk-acoustic wave resonator comprising:
a substrate;
a sacrificial layer;
a connection layer disposed on the substrate;
a first electrode disposed on an upper surface of the connection layer; and
connection electrodes disposed on a lower surface of the connection layer,
wherein the connection layer is disposed within the sacrificial layer, and
wherein the connection electrodes are disposed to penetrate the substrate.

19. The bulk-acoustic wave resonator of claim 18, wherein the connection layer comprises a first metal layer, and a barrier layer disposed below the first metal layer.

\* \* \* \* \*